United States Patent [19]

Ozeki et al.

[11] 4,385,386
[45] May 24, 1983

[54] LASER APPARATUS

[75] Inventors: Takeshi Ozeki; Toshifumi Tamura, both of Tokyo, Japan

[73] Assignee: Tokyo Shibaura Denki Kabushiki Kaisha, Kawasaki, Japan

[21] Appl. No.: 285,453

[22] Filed: Jul. 21, 1981

[30] Foreign Application Priority Data

Jul. 25, 1980 [JP] Japan .................................. 55-102278

[51] Int. Cl.³ ............................................. H01S 3/13
[52] U.S. Cl. ........................................ 372/28; 372/20; 372/29
[58] Field of Search ....................... 372/20, 19, 24, 25, 372/26, 28, 29, 32, 43

[56] References Cited

PUBLICATIONS

"Integrated Electro-Optic Intracavity Freq. Modulation of Double-Heterostructure Injection Laser" Reinhart et al.; App. Phys. Lett. vol. 27, No. 10, Nov. 15, 1975.

Primary Examiner—William L. Sikes
Assistant Examiner—Léon Scott, Jr.
Attorney, Agent, or Firm—Cushman, Darby & Cushman

[57] ABSTRACT

A laser apparatus including first and second frequency sweeping laser devices, the sweep frequency range of each being different. The output laser beams of the first and second laser devices are multiplexed by a multiplexer. The output laser beam of the multiplexer is transmitted to a photodetector for detecting the difference in frequency between those of the first and second laser devices. A frequency monitor, coupled to the photodetector, provides a signal to a control circuit which causes the first and second laser devices to sequentially sweep their respective sweep frequency ranges.

18 Claims, 7 Drawing Figures

FIG. 2
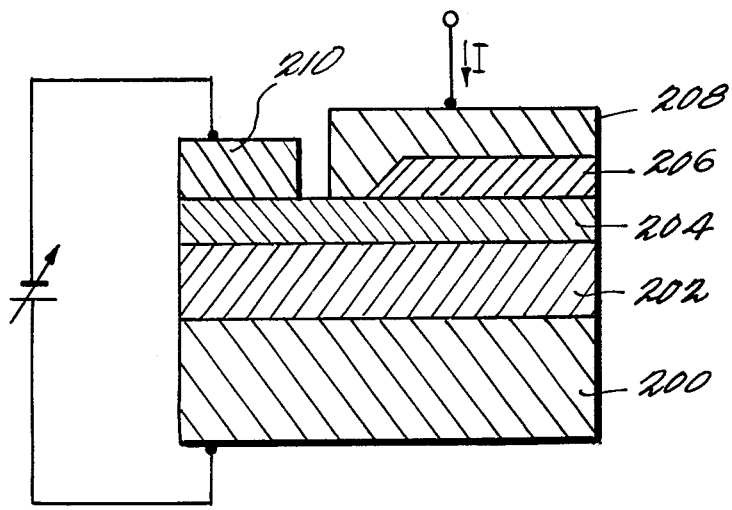
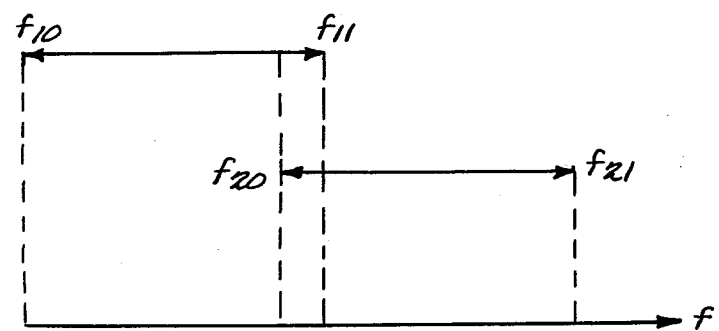
FIG. 3

LASER APPARATUS

BACKGROUND OF THE INVENTION

This invention relates to laser apparatus, and more particularly to laser apparatus of the type which can successively sweep the frequency of the laser's output beam over a wide range.

There is frequently a requirement in optical communications, measurement and other fields for a laser apparatus the output beam of which can be swept in frequency over a wide range. A known laser apparatus which can sweep the frequency of its output beam comprises a laser device such as a semiconductor, dye, or solid state laser and a pair of optical resonators having wavelength selectivity. The frequency of such a laser apparatus is swept by successively changing the angle of the optical resonators. Another type of known laser apparatus has a non-linear crystal. The frequency of this apparatus then may be swept by changing the temperature of the non-linear crystal. These known laser apparatuses, however, are bulky and cannot sweep the frequency quickly enough.

Semiconductor lasers which can rapidly sweep their frequency bands are known. Such a laser is described in a paper entitled "Integrated Electro-Optic Intracavity Frequency Modulation of Double-Heterostructure Injection Laser" by F. K. Reinhart et al, Applied Physics Letter, Vol. 27, No. 10, Nov. 15, 1975. However, this type of laser apparatus is limited in the range of frequencies over which it can sweep.

SUMMARY OF THE INVENTION

It is therefore an object of this invention to provide a laser apparatus which can sweep the frequency of its output beam over a wide range.

It is another object of this invention to provide a laser apparatus which can rapidly sweep its frequency.

It is yet another object of this invention to provide a relatively small-sized laser apparatus.

Specifically, the present invention provides a laser apparatus for use in the field of communications. It includes a first laser device able to sweep a first frequency band, and a second laser device able to sweep a second frequency band different from the first frequency band, portions of the first and second bands overlapping each other. The invention also includes a multiplexer for multiplexing the laser beams emanating from the first and second laser devices. A photodetector which detects the difference between frequencies of the first and second laser devices receives the output of the multiplexer. Control means connected to the photodetector cause the laser devices sequentially and alternately to sweep their respective frequency bands.

BRIEF DESCRIPTION OF THE DRAWINGS

Other objects and features of this invention will become apparent to those skilled in the art from the following detailed description of preferred embodiments of the invention and the claims, as illustrated in the accompanying drawings, in which:

FIG. 2 is a sectional view of the laser devices shown in FIG. 1;

FIG. 3 is a graphical representation of the frequency sweeping ranges of the laser devices shown in FIG. 1;

DESCRIPTION OF THE PREFERRED EXEMPLARY EMBODIMENT

Figure 1:
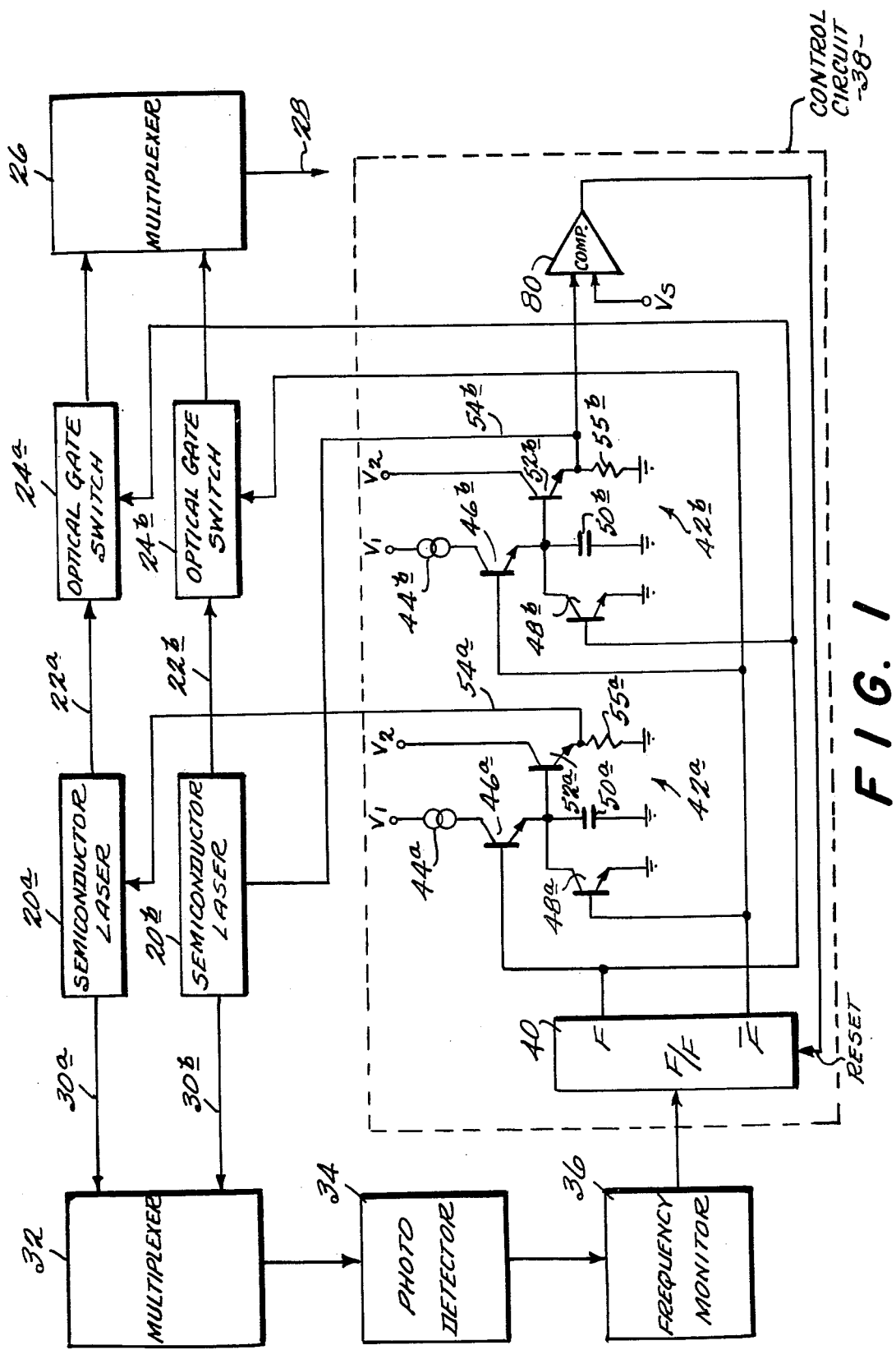
FIG. 1 is a schematic view of a preferred embodiment of the laser apparatus according to the present invention.

FIG. 1 shows a schematic view of a laser apparatus of the present invention. This laser apparatus includes a first laser device 20a and a second laser device 20b. These laser devices may be any laser device capable of altering its frequency in response to an electrical signal. In the preferred embodiment first and second laser devices 20a and 20b are selected to be semiconductor lasers of the type described in the article by F. K. Reinhart referred to earlier. First laser device 20a is designed to have a sweep frequency band from a lower frequency $f_{10}$ to upper frequency $f_{11}$. Second laser device 20b is designed to have a sweep frequency band from a lower frequency $f_{20}$ (less than $f_{11}$) to an upper frequency $f_{21}$ (greater than $f_{11}$). The sweep frequency range of second laser device 20b is different from that of first laser device 20a except for an overlapping range of frequencies $f_{20}$–$f_{11}$.

Laser output beams 22a and 22b emanate from first output faces of laser devices 20a and 20b respectively, and are transmitted to a first multiplexer 26 through optical gate switches 24a and 24b, respectively. First multiplexer 26 multiplexes laser output beams 22a and 22b and transmits the resulting laser beam 28 to an output port thereof.

Laser output beams 30a and 30b emanate from second output faces of laser devices 20a and 20b, respectively, and are transmitted to a second multiplexer 32 for multiplexing the laser output beams. The output beam of second multiplexer 32 is transmitted to a photodetector 34, which may be a photodiode.

Photodetector 34 senses the difference between the frequencies of the components of output laser beams 30a and 30b of first and second laser devices 20a and 20b in the output of multiplexer 32 and generates an output electric signal having a frequency related to the differential frequency.

The output signal of photodetector 34 is coupled to a frequency monitor 36 such as a frequency counter or a combination circuit including a low-pass filter and a level detector. Frequency monitor 36 continuously monitors the frequency of the output signal from photodetector 34. Frequency monitor 36 generates a control signal when the frequency of the output from photodetector 34 approaches zero and applies the control signal to a control circuit 38.

Control circuit 38 comprises a T-type flip-flop circuit 40 whose output state is inverted whenever an input pulse is received, a first voltage circuit 42a, and a second voltage circuit 42b. The input terminal of flip-flop circuit 40 is connected to the output terminal of frequency monitor 36 and the output terminals F and $\overline{F}$ of flip-flop circuit 40 are connected to first and second voltage sweep circuits 42a and 42b, respectively.

First voltage sweep circuit 42a includes a first transistor 46a having its base connected to the output terminal F of flip-flop circuit 40 and its collector connected to a constant current source 44a. A second transistor 48a has its base connected to the output terminal $\overline{F}$ of flip-flop circuit 40, its collector connected to the emitter electrode of first transistor 46a, and its emitter electrode connected to the ground. A capacitor 50a is connected between the emitter electrode of first transistor 46a and ground. The collector of transistor 48a and the emitter of transistor 46a are also connected to the base of transistor 52a, which is used in an emitter follower configuration. Accordingly, the collector of transistor 52a is connected to voltage source $V_2$, and the emitter is connected to ground through resistor 55a. The output 54a, taken from the emitter of transistor 52a is applied as a sweep control signal to first semiconductor laser 20a.

Second voltage sweep circuit 42b has the same configuration as first voltage sweep circuit 40a except that the bases of a first transistor 46b and a second transistor 48b are connected to the outputs $\overline{F}$ and F of flip-flop circuit 40 respectively, and the output 54b of transistor 52b is applied as a sweep control signal to second semiconductor laser 20b.

The outputs F and $\overline{F}$ of flip-flop circuit 40 are also coupled as switching control signals to optical gate switches 24a and 24b, respectively. Thus, optical gate switches 24a and 24b are controlled so that when one optical gate switch is "ON", the other optical gate switch is "OFF".

Referring now to FIG. 2, there is shown a sectional view of the semiconductor laser devices used in the presently preferred embodiment. These laser devices include an n-GaAs substrate 200, an n-GaAlAs cladding layer 202 disposed on substrate 200, an optical waveguide layer 204 disposed on cladding layer 202, an n-GaAs tapered active waveguide layer 206 disposed on optical waveguide layer 204, a P-GaAlAs cladding layer 208 disposed on active waveguide layer 206, and a P-GaAlAs cladding layer 210 disposed on optical waveguide layer 204. Namely, the laser devices have double-heterostructure. Laser oscillation may take place by supplying a current I to the P-N junction between cladding layer 208 and active waveguide layer 206. The oscillation frequency of the laser device may be swept by successively changing a control voltage supplied between cladding layer 210 and substrate 200 to change the refractive index of optical waveguide layer 204. The operation of the embodiment having the above construction will now be described.

Referring now to FIG. 3, let it be assumed that first laser device 20a can, in response to a voltage signal, vary the frequency $f_{1x}$ of its output beam 22a between $f_{10}$ and $f_{11}$, and that second laser device 20b can similarly vary the frequency $f_{2x}$ of its beam 22b between $f_{20}$ and $f_{21}$. Let it be further assumed that $f_{1x}=f_{10}$ and $f_{2x}=f_{20}$ and optical gate switch 24a is "ON" and optical gate switch 24b is "OFF" at the initial state. In this state only the output laser beam 22a from first laser device 20a reaches first multiplexer 26. On the other hand, output laser beams 30a and 30b are both multiplexed by second multiplexer 32. The multiplexed laser beam is transmitted to photodetector 34. Photodetector 34 detects the differential frequency signal component in this case $\Delta f=f_{20}-f_{10}$, between the output laser beams of first and second laser devices 20a and 20b in the multiplexed laser beam.

Figure 4:
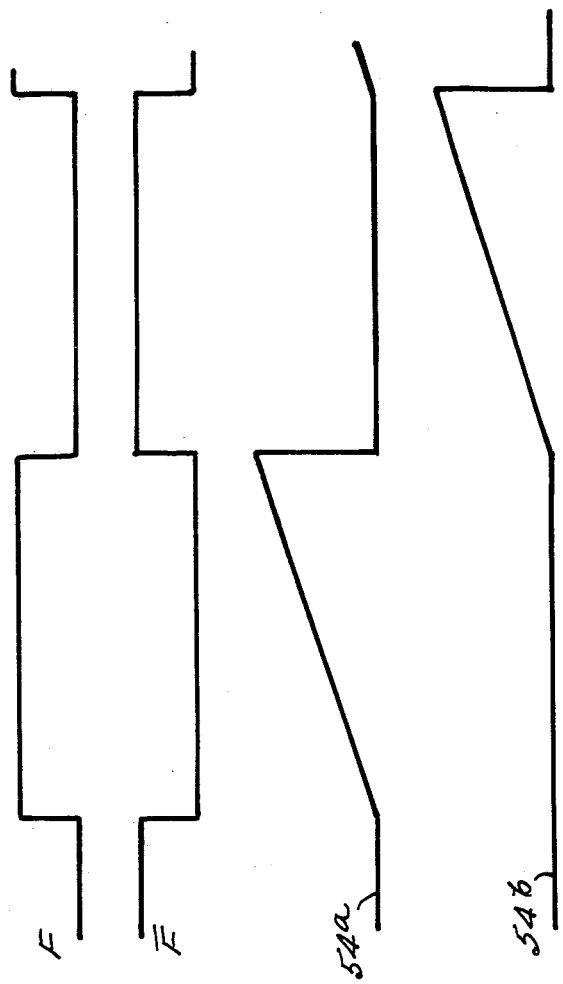
FIGS. 4A to 4D are graphical representations of various waveforms explaining the operation of the laser apparatus shown in FIG. 1.

Initially, flip-flop circuit 40 in control circuit 38 is set with output F at logic "1" and output $\overline{F}$ at logic "0", as shown in FIGS. 4A and 4B. Under these conditions, first transistor 46a in voltage sweep circuit 42a is operative and second transistor 46b is not operative. In the operation of first transistor 46a the current I from constant current source 44a flows into capacitor 50a through first transistor 46a and an electric charge is accumulated in it. This causes the output voltage 54a of emitter follower circuit 52a, which serves as sweep control voltage for first laser device 20a, to rise gradually as shown in FIG. 4C and first laser device 20a responds by sweeping its characteristic frequency band. The oscillation frequency $f_{1x}$ of first laser device 20a thus rises gradually from the lowest frequency $f_{10}$ to the high frequency $f_{11}$.

During this entire process, frequency $f_{2x}$ of second laser device 20b remains constant ($f_{2x}=f_{20}$). Therefore, the output frequency of photodetector 34 may be expressed as follows:

$$\Delta f = f_{20} - f_{1x}$$

This differential frequency $\Delta f$ decreases as the frequency $f_{1x}$ increases. As $\Delta f$ approaches zero, frequency monitor 36 delivers a control signal to flip-flop circuit 40 in control circuit 38. This control signal inverts the output state of flip-flop circuit 40 as shown in FIGS. 4A and 4B. Thus, the output F inverts to logic "0" and the output $\overline{F}$ inverts to logic "1". In voltage sweep circuit 42a, first transistor 46a cuts off and second transistor 48a turns on, and the electric charge accumulated in capacitor 50a is discharged instantly to the ground through second transistor 48a. The output of transistor 52a as the sweep control signal for first laser device 20a reduces as shown in FIG. 4C. Accordingly, first laser device 20a ceases sweeping of its frequency band and assumes the value $f_{10}$.

Meanwhile in voltage sweep circuit 42b, first transistor 46b connected to the output $\overline{F}$ of flip-flop circuit 40 turns on and second transistor 48b connected to the output F of flip-flop circuit 40 cuts off. The current I from constant current source 44b then flows into capacitor 50b through first transistor 46b and an electric charge is accumulated in it. The output voltage 54b of transistor 52b rises gradually as shown in FIG. 4D and second laser device 20b begins to sweep its frequency band. At the same time optical gate switch 24b switches "ON" and optical gate switch 24a is changed to "OFF" by the inversion of the output of flip-flop circuit 40. Therefore, in this state the output laser beam 22b of second laser device 20b reaches first multiplexer 26, while output laser beam 22a does not.

The frequency $f_{2x}$ of second laser device 20b is swept from its lowest frequency $f_{20}$ to its highest frequency $f_{21}$. Accordingly, the frequency of the laser apparatus according to this embodiment may be swept successively from the frequency $f_{10}$ which is the lowest frequency of first laser device 20a to the frequency $f_{21}$ which is the highest frequency of second laser device 20b.

Figure 5:
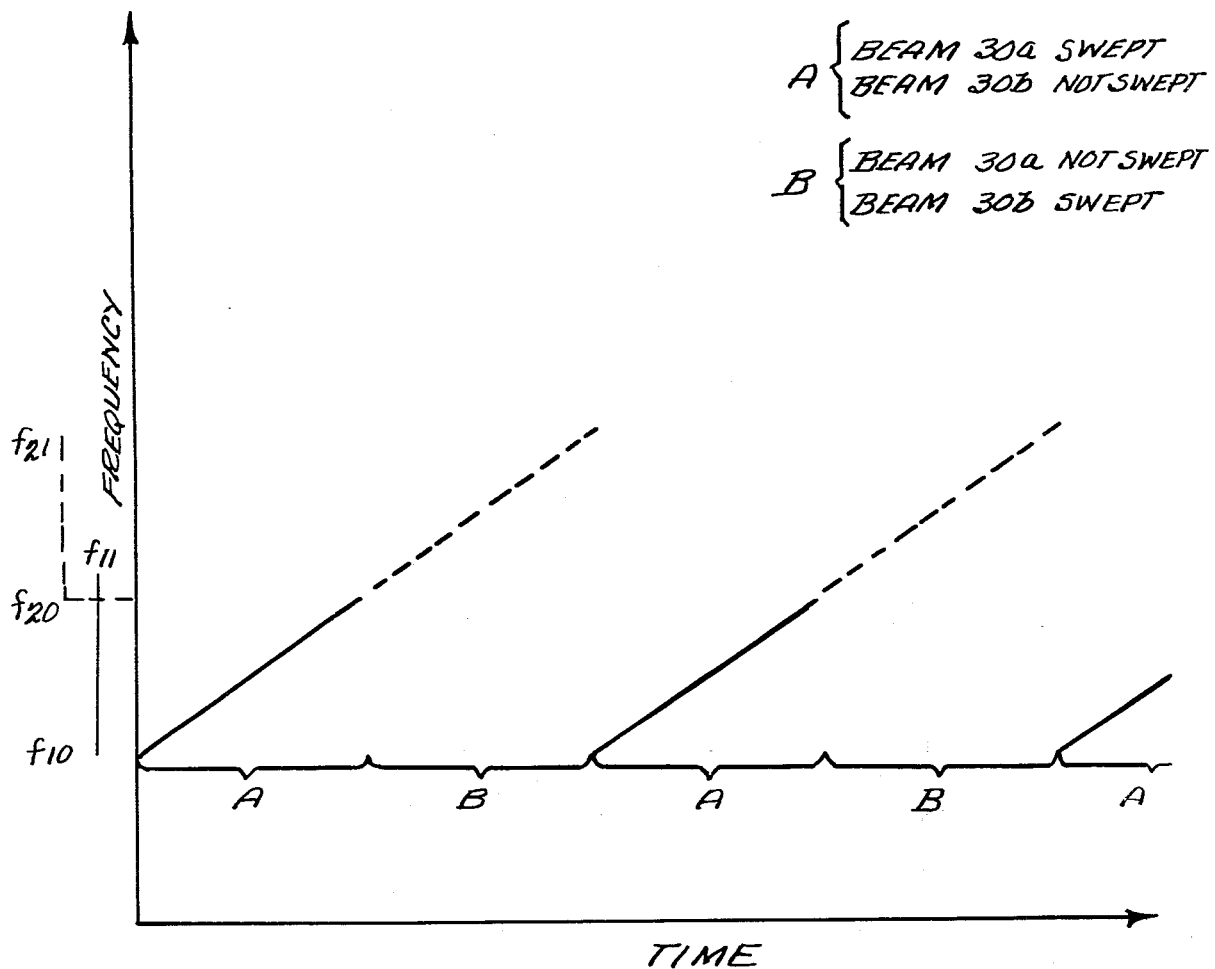
FIG. 5 is a graphical representation of frequency sweep output beam with respect to time illustrating the operation of the laser apparatus shown in FIG. 1.

When the frequency of second laser device 20b reaches $f_{21}$, a control signal is generated for resetting flip-flop 40. This signal is generated as follows. The voltage at the emitter of transistor 52b, which causes laser 20b to sweep, is compared in a comparator 80 with a reference signal Vs. A comparison signal is generated when this emitter voltage becomes greater than Vs. This comparison signal is coupled to the reset input of flip-flop 40. This control signal inverts the output state of flip-flop circuit 40. Accordingly, second laser device 20b ceases sweeping of its frequency band and first laser device begins to sweep its frequency band again. The operation mentioned above is carried out repeatedly and the first and second frequency bands are swept sequentially and alternately as shown in FIG. 5.

As described above, a laser apparatus according to the present invention can sweep the frequency of the laser oscillation signal over a wide range and can sweep it quickly because the output frequency of the laser devices 20a and 20b may be swept by changing the sweep control voltage. Furthermore, the laser apparatus of the present invention has a relatively simple and compact construction.

Figure 6:
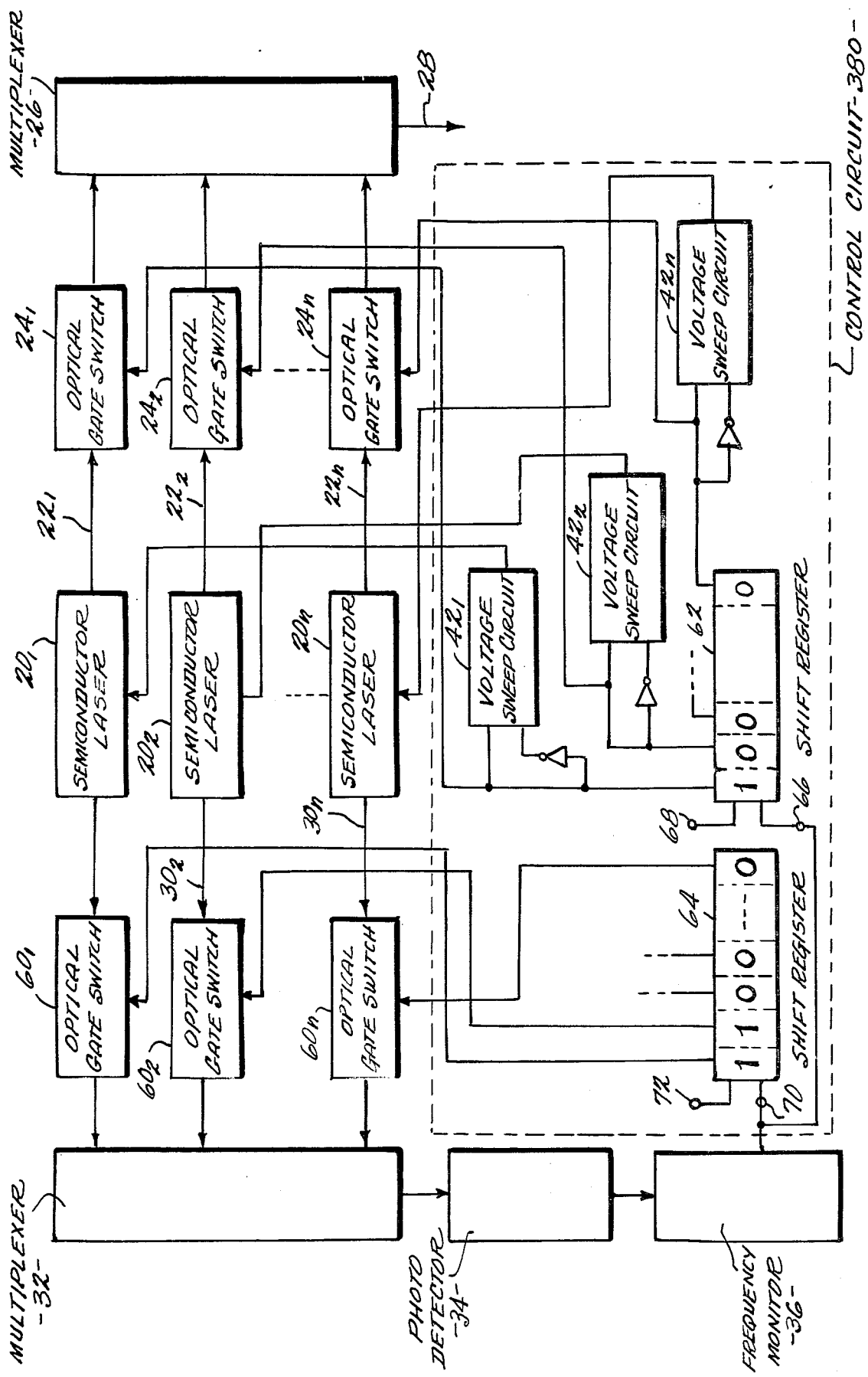
FIG. 6 is a schematic view of an alternative embodiment of the present invention.

FIG. 6 illustrates another embodiment of the present invention in which a multiplicity of laser devices is used to expand the sweep frequency range.

The sweep frequency ranges of semiconductor lasers $20_1, 20_2, \ldots,$ and $20_n$ are different respectively except for a part of overlapped ranges. That is, the maximum frequency of semiconductor laser $20_1$ marginally exceeds the minimum frequency of semiconductor laser $20_2$, whose maximum frequency in turn just barely exceeds the minimum frequency of semiconductor laser $20_3$. In general, the maximum frequency of semiconductor laser $20_{n-1}$ will just barely exceed the minimum frequency of semiconductor laser $20_n$.

Laser output beams $22_1, 22_2, \ldots,$ and $22_n$ emerge from each first output face of semiconductor laser $20_1$, through the optical gate switches $24_1, 24_2 \ldots,$ and $24_n$, respectively.

Laser output beams $30_1, 30_2, \ldots,$ and $30_n$ emerge from each second output face of semiconductor lasers $20_1, 20_2 \ldots,$ and $20_n$ are transmitted to the second multiplexer 32 through optical gate switches $60_1, 60_2 \ldots,$ and $60_n$ respectively. The output laser beam from second multiplexer 32 is converted into an electric signal by the photodetector 34. The output of photodetector 34 is delivered to the frequency monitor 36. The output of frequency monitor 36 is delivered to a control circuit 380 which comprises the voltage sweep circuits $42_1, 42_2, \ldots$ and $42_n$ as shown in FIG. 1, a first shift register 62 for controlling the operation of voltage sweep circuits $42_1, 42_2 \ldots,$ and $42_n$ and first optical gate switches $24_1, 24_2, \ldots,$ and $24_n$, and a second shift register 64 for controlling the operation of second optical gate switches $60_1, 60_2, \ldots,$ and $60_n$. First shift register 62 has a first input terminal 66 responsive to the output of frequency monitor 36 and a second input terminal 68 to which a logic signal "1" is applied at the beginning of a sweep operation. The logic signal "1" in the shift register 62 is shifted one bit whenever an output pulse has been received from frequency monitor 36. The output of each stage of first shift register 62 is applied to one of voltage sweep circuits $42_1, 42_2, \ldots,$ and $42_n$ and first optical gate switches $24_1, 24_2, \ldots,$ and $24_n$, respectively. Therefore, exactly one of the voltage sweep circuits and its associated first optical gate switch are always operational.

Second shift register 64 has a first input terminal 70 connected to the output from frequency monitor 36 and a second input terminal 72 through which a pair of logic signals "1" are input into second shift register 64 at the beginning of the sweep operation. The pair of logic signals "1" are shifted one bit upon receipt of output from frequency monitor 36. The output of each stage of second shift register 64 is applied to second optical gate switches $60_1, 60_2, \ldots,$ and $60_n$, respectively. Therefore, an adjacent pair of second optical gate switches is always "ON".

Figure 7:
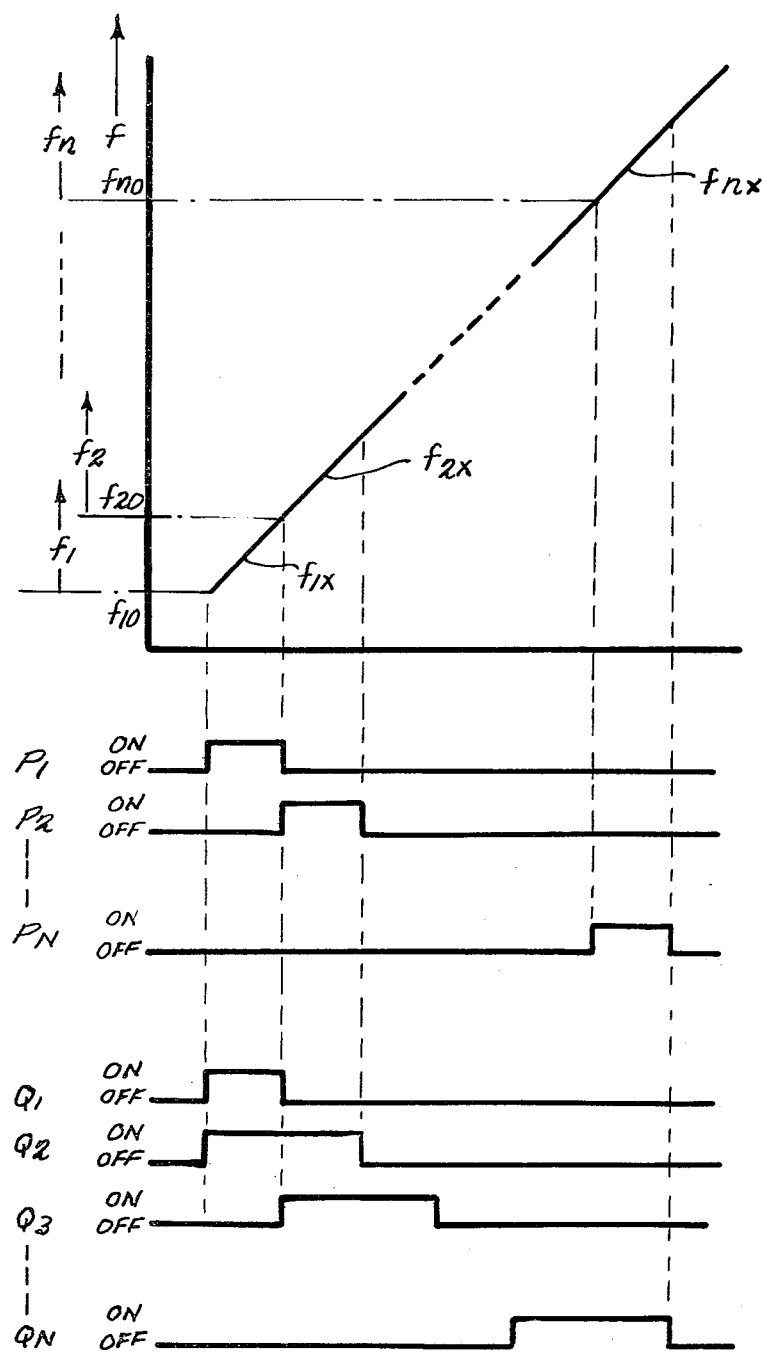
FIG. 7 is a graphical representation of various waveforms explaining the laser apparatus shown in FIG. 6.

The operation of the embodiment having the above-mentioned construction will now be described with reference to FIG. 7. In FIG. 7, P1, P2, . . . , and Pn indicate whether first optical gate switches $24_1, 24_2, \ldots,$ and $24_n$ are "ON" or "OFF". Similarly, Q1, Q2, . . . , and Qn indicate whether second optical gate switches $60_1, 60_2, \ldots,$ and $60_n$ are "ON" or "OFF".

As an initial condition, each semiconductor laser $20_1, 20_2, \ldots,$ and $20_n$ oscillates at its lowest frequency $f_{10}, f_{20}, \ldots,$ and $f_{no}$, optical gate switch $24_1$ is "ON", optical gate switches $24_1, 24_2, \ldots,$ and $24_n$ are "OFF", and optical gate switches $60_1$ and $60_2$ are "ON" and optical gate switches $60_1, 60_2, \ldots,$ and $60_n$ are "OFF".

As the oscillation frequency of semiconductor laser $20_1$ gradually increases in response to an increasing voltage signal from voltage sweep circuit $42_1$, an output signal having a frequency representing the difference between frequencies $f_{1x}$ and $f_{20}$ of semiconductor lasers $20_1$ and $20_2$ appears at photodetector 34. As $f_{1x}$ approaches very close to $f_{20}$, frequency monitor 36 applies a control signal to control circuit 380. Control circuit 380 turns optical gate switches $24_1$ and $60_1$ "OFF" and turns optical gate switches $24_2$ and $60_3$ "ON". Control circuit 380 also halts the sweep operation of semiconductor laser $20_1$ and initiates the sweep operation of semiconductor laser $20_2$. Then, as $f_{2x}$ approaches very close to $f_{30}$, optical gate switches $24_1$ and $60_2$ are turned "OFF", optical gate switches $24_3$ and $60_4$ are turned "ON" and semiconductor laser $20_3$ starts sweeping the oscillation frequency in place of semiconductor laser $20_2$. These "hand-offs" occur repeatedly until the semiconductor laser $20_n$ having the highest maximum frequency has completed its sweep. Thereby, the oscillation frequency of laser apparatus according to this embodiment may be swept successively from the frequency $f_{10}$ which is the lowest oscillation frequency of semiconductor $20_1$ to the frequency $f_{n1}$ which is the highest oscillation frequency of semiconductor laser $20_n$.

As alternatives to the embodiments shown in FIGS. 1 and 6, the semiconductor laser devices 20a, 20b, $20_1, 20_2, \ldots 20_n$ may be replaced by another laser device capable of sweeping a frequency bandwidth in response to a voltage control signal. Also, the number of laser devices $20_1, 20_2, \ldots,$ and $20_n$ shown in FIG. 6 may be selected with reference to the desired sweep oscillation range and a sweep oscillation range of the individual laser devices. Second optical gate switches $60_1, 60_2, \ldots,$ and $60_n$ shown in FIG. 6 need not be employed if adjacent pairs of conductor laser devices are driven sequentially. The sweep of the oscillation frequency of the laser devices may also progress in reverse from the highest oscillation frequency toward the lowest oscillation frequency. The control circuits 38 and 380 are not limited to the embodiments shown in FIGS. 1 and 6.

While the invention has been described in connection with what is presently considered to be the most practical and preferred embodiments, it is to be understood that the invention is not to be limited to the disclosed embodiments but on the contrary, is intended to cover various modifications and equivalent arrangements included within the spirit and scope of the appended claims which scope is to be accorded the broadest interpretation so as to encompass all such modifications and equivalent structures.

What is claimed is:

1. An apparatus for sweeping a frequency bandwidth of optical radiation comprising:
   a first laser device capable of sweeping a first portion of said frequency bandwidth;
   a second laser device capable of sweeping a second portion of said frequency bandwidth, there being an overlap of common frequencies in said first and second portions;
   means connected to said laser devices for multiplexing a first beam emitted by said first laser device with a second beam emitted by said second laser device;
   detecting means responsive to said multiplexing means for detecting the difference between the frequencies of said first and second beams; and
   control means responsive to said detecting means for causing one of said laser devices to sweep its associated portion until said difference assumes a predetermined value; and then causing the other of said laser devices to sweep its associated portion.

2. An apparatus according to claim 1 in which said first and second laser devices are semiconductor laser devices the frequencies of which are swept in response to sweep control signals.

3. An apparatus according to claim 1, in which said first and second laser devices each have first and second output faces from which beams emanate; the beam emanating from said first output face being transmitted to an output port and the beam emanating from said second output face being transmitted to said multiplexing means.

4. An apparatus according to claim 1 or 3 in which said detecting means comprises:
   a photodetector connected to said multiplexing means for generating an output electric signal having a frequency related to the difference between the frequencies of said first and second beams; and
   a frequency monitor connected to said photodetector for monitoring the frequency of said output electrical signal of said photodetector and producing an output when said output frequency of said photodetector attains a predetermined value.

5. An apparatus according to claim 3, further comprising, a first and second optical gate switches disposed in the paths of the beams emanated from said first output faces, respectively; said first and second optical gate switches being switched to pass only one of said beams to the exclusion of the other by said control means.

6. An apparatus according to claim 1, in which said control means comprises:
   a first voltage sweep circuit for causing said first laser device to sweep its frequency band,
   a second voltage sweep circuit for causing said second laser device to sweep its frequency band; and
   switching means connected to said detecting means for switching the sweep operation of said first and second voltage sweep circuits when the output from said frequency monitor is received.

7. An apparatus according to claim 6, in which said switching means is a flip-flop circuit the output state of which is inverted when the output from said frequency monitor is received.

8. An apparatus according to claim 6, in which the first and second voltage sweep circuits each comprise a capacitor,
   a first switching transistor connected to said capacitor for selectively supplying a current to said capacitor and
   a second switching transistor connected to said capacitor for selectively discharging said capacitor, said first and second switching transistors being switched by said switching means.

9. An apparatus comprising:
   a plurality of laser devices each being capable of sweeping the freuqency of their respective output beams over a predetermined band of frequencies, the sweep ranges of said laser devices being different from each other but overlapping one another;
   sweep means for sequentially sweeping the output beam frequency of each laser device according to a predetermined order;
   multiplexing means for multiplexing the output beam from two of the laser devices;
   photodetecting means responsive to said multiplexing means for detecting the difference of the oscillation frequency between the two laser beams multiplexed by said multiplexing means; and
   control means responsive to said photodetecting means for switching the sweep operation of said sweep means in accordance with said predetermined order whenever the difference of the frequency between said two laser beams approaches a predetermined value.

10. An apparatus according to claim 9, in which said laser devices each have first and second output faces from which beams are emanated; the beam emanated from said first output face being transmitted to an output port; the beam emanated from said second output face being transmitted to said multiplexing means.

11. An apparatus according to claim 10, further comprising first optical gate switching means disposed in the paths of the beams emanated from said first output faces for selectively passing their respective beams, said first optical gate switching means being switched to pass one beam from the laser device which is sweeping its frequency to the exclusion of the others in order by said control means.

12. An apparatus according to claim 9 or 11, in which said control means comprises:
   a first shift register responsive to said photodetecting means for switching the operation of the sweep means and the first optical gate switching means; and
   a second shift register responsive to said photodetecting means for switching the operation of the second optical gate switching means.

13. An apparatus according to claim 10, further comprising second optical gate switching means disposed in the paths of the beams emanated from said second output faces for selectively passing their respective beams, said second optical gate switching means being switched to selectively pass the beams from two laser devices one of which is sweeping its frequency and the other of which has a sweep frequency range overlapped with that of said one laser device, the remaining beams being blocked by their respective optical gate switching means under the control of said control means.

14. An apparatus according to claim 9 or 10, in which said photodetecting means comprises:
   a photodetector connected to said multiplexing means for generating an output electric signal having a frequency related to the differential frequency between the two beams multiplexed by said multiplexing means; and a frequency monitor connected to said photodetector for monitoring the frequency of said output electrical signal and producing an output when said output frequency of said photodetector reaches a predetermined value.

15. A method for generating a beam sweeping a frequency bandwidth of optical radiation, comprising the steps of:
(a) producing a first laser beam from a first device capable of sweeping a first portion of said frequency bandwidth;
(b) sweeping said first portion of said frequency bandwidth, said first portion having as its lowest frequency the lowest frequency of said frequency bandwidth;
(c) producing a second laser beam from a second device capable of sweeping a second portion of said frequency bandwidth, said second portion having as its highest frequency the highest frequency of said frequency bandwidth and as its lowest frequency a frequency that is lower than the highest frequency of said first portion; and
(d) sweeping said second portion.

16. A method according to claim 15, in which the first and second portion of the frequency bandwidth are swept sequentially.

17. A method according to claim 15, further comprising the steps of:
multiplexing the first laser beam and the second laser beam;
detecting the difference between the frequency of said first and second beams in the multiplexed laser beam;
causing said first laser device to sweep said first portion until said difference becomes a predetermined value; and then
causing said second laser device to sweep said second portion.

18. A method according to claim 15, further comprising the step of:
passing one of said first and second laser beams to the exclusion of the other, said one beam being the laser beam from the device which is sweeping the frequency bandwidth.

* * * * *